(12) United States Patent
Kotler et al.

(10) Patent No.: US 7,945,087 B2
(45) Date of Patent: May 17, 2011

(54) ALIGNMENT OF PRINTED CIRCUIT BOARD TARGETS

(75) Inventors: Zvi Kotler, Tel Aviv (IL); Eliezer Lipman, Rishon Lezion (IL); Golan Hanina, Rishon Lezion (IL); Boris Greenberg, Jerusalem (IL); Michael Zenou, Shivai Zion (IL)

(73) Assignee: Orbotech Ltd., Yavne (IL)

( * ) Notice: Subject to any disclaimer, the term of this patent is extended or adjusted under 35 U.S.C. 154(b) by 995 days.

(21) Appl. No.: 11/768,118

(22) Filed: Jun. 25, 2007

(65) Prior Publication Data

US 2008/0044059 A1    Feb. 21, 2008

Related U.S. Application Data

(60) Provisional application No. 60/816,332, filed on Jun. 26, 2006.

(51) Int. Cl.
*G06K 9/00* (2006.01)
(52) U.S. Cl. ............ 382/151; 250/491.1; 250/559.3; 356/237.6; 356/399
(58) Field of Classification Search ............ 219/121.71; 250/559.08, 559.4; 356/124, 237.2, 237.6, 356/247, 399; 382/151
See application file for complete search history.

(56) References Cited

U.S. PATENT DOCUMENTS

| | | | |
|---|---|---|---|
| 4,279,472 A | 7/1981 | Street | |
| 4,649,497 A | 3/1987 | Carleson et al. | |
| 4,667,113 A * | 5/1987 | Nakajima et al. | 250/559.4 |
| 4,918,284 A | 4/1990 | Weisz | |
| 4,998,005 A | 3/1991 | Rathi et al. | |
| 5,359,203 A | 10/1994 | Hashii et al. | |
| 5,365,034 A | 11/1994 | Kawamura et al. | |
| 5,694,214 A * | 12/1997 | Watanabe et al. | 356/237.2 |
| 5,751,594 A | 5/1998 | Stanley et al. | |
| 5,974,019 A * | 10/1999 | Belser et al. | 369/112.05 |
| 6,046,429 A | 4/2000 | Datta | |
| 6,192,059 B1 * | 2/2001 | Karioja et al. | 372/20 |
| 6,239,406 B1 | 5/2001 | Onoma et al. | |

(Continued)

FOREIGN PATENT DOCUMENTS

CN    1675020 A    9/2005

(Continued)

OTHER PUBLICATIONS

"A novel CMOS sensor for position detection" by De Nisi, et al., published in Sensors, 2003, vol. 2, Proceedings of IEEE.

(Continued)

*Primary Examiner* — Gregory M Desire
(74) *Attorney, Agent, or Firm* — Sughrue Mion, PLLC (57) ABSTRACT

A method for micromachining a material, including configuring an optical system to provide illumination of an illumination wavelength to a site via a given element of the optical system, the illumination generating returning radiation from the site. The method further includes configuring the optical system to receive the returning radiation via the given element, and to form an image of the site therefrom, calculating an actual position of a location at the site from the image and outputting a signal indicative of the actual position of the location, generating a beam of micromachining radiation having a micromachining wavelength different from the illumination wavelength, positioning the beam to form an aligned beam with respect to the location in response to the signal, and conveying the aligned beam to the location via at least the given element of the optical system so as to perform a micromachining operation at the location.

46 Claims, 7 Drawing Sheets

U.S. PATENT DOCUMENTS

| | | |
|---|---|---|
| 6,256,121 B1 | 7/2001 | Lizotte et al. |
| 6,615,099 B1 | 9/2003 | Muller et al. |
| 6,804,574 B2 | 10/2004 | Liu et al. |
| 6,809,290 B2 | 10/2004 | Gross et al. |
| 6,862,089 B2 * | 3/2005 | Goto et al. ................. 356/237.6 |
| 6,911,620 B2 | 6/2005 | Lipman et al. |
| 6,938,334 B2 * | 9/2005 | Yu ................................... 29/830 |
| 6,951,627 B2 | 10/2005 | Li et al. |
| 6,955,284 B2 | 10/2005 | Zakel et al. |
| 7,462,802 B2 * | 12/2008 | Hiramatsu ............... 219/121.71 |
| 7,593,029 B2 * | 9/2009 | Satoh et al. ................... 347/243 |
| 2002/0008093 A1 | 1/2002 | Ukita et al. |
| 2002/0117486 A1 | 8/2002 | Christensen et al. |
| 2003/0003382 A1 * | 1/2003 | Sherrer et al. ................. 430/22 |
| 2003/0010936 A1 * | 1/2003 | Udagawa et al. ........ 250/492.21 |
| 2003/0019854 A1 | 1/2003 | Gross et al. |
| 2003/0024912 A1 | 2/2003 | Gross et al. |
| 2003/0024913 A1 | 2/2003 | Downes et al. |
| 2003/0042230 A1 | 3/2003 | Gross et al. |
| 2003/0052099 A1 | 3/2003 | Lipman et al. |
| 2003/0062345 A1 | 4/2003 | Wagner |
| 2003/0168434 A1 | 9/2003 | Gross et al. |
| 2004/0017429 A1 | 1/2004 | Liu et al. |
| 2004/0019403 A1 | 1/2004 | Liu et al. |
| 2004/0019404 A1 | 1/2004 | Cheng |
| 2004/0056009 A1 | 3/2004 | Gross et al. |
| 2004/0112876 A1 | 6/2004 | Wantabe |
| 2004/0137731 A1 | 7/2004 | Glazer et al. |
| 2004/0162629 A1 | 8/2004 | Kondou et al. |
| 2004/0222197 A1 | 11/2004 | Hiramatsu |
| 2004/0222202 A1 | 11/2004 | Johnson et al. |
| 2005/0056626 A1 | 3/2005 | Gross et al. |
| 2005/0056627 A1 | 3/2005 | Gross et al. |
| 2005/0187651 A1 | 8/2005 | Kimura et al. |
| 2005/0205530 A1 | 9/2005 | Picard et al. |
| 2005/0205539 A1 | 9/2005 | Borgoltz et al. |
| 2005/0232316 A1 | 10/2005 | Akasaka et al. |
| 2006/0037949 A1 | 2/2006 | Giloh |
| 2006/0060573 A1 | 3/2006 | Becker et al. |
| 2006/0081575 A1 | 4/2006 | Egawa et al. |
| 2006/0096956 A1 | 5/2006 | Indou et al. |
| 2006/0102601 A1 | 5/2006 | Shirk et al. |
| 2006/0102608 A1 | 5/2006 | Katsuta et al. |
| 2006/0138097 A1 | 6/2006 | Hiramatsu |
| 2006/0138098 A1 | 6/2006 | Hiramatsu |
| 2006/0146395 A1 | 7/2006 | Gross et al. |
| 2007/0008534 A1 | 1/2007 | Lo et al. |

FOREIGN PATENT DOCUMENTS

| | | |
|---|---|---|
| JP | 2006263803 | 5/2006 |

OTHER PUBLICATIONS

Basler Brochure: A601f, A602f, and A622f, Basler Vision Technologies, Apr. 2006.

U.S. Appl. No. 11/472,325, filed Jun. 22, 2006, Slor et al.

* cited by examiner

ALIGNMENT OF PRINTED CIRCUIT BOARD TARGETS

CROSS-REFERENCE TO RELATED APPLICATION

This application claims the benefit of U.S. Provisional Patent Application 60/816,332, filed 26 Jun., 2006, which is incorporated herein by reference.

FIELD OF THE INVENTION

The present invention relates generally to optical alignment, and specifically to optical alignment of a target to be processed in a printed circuit board.

BACKGROUND OF THE INVENTION

Laser micromachining is employed to form holes, inter alia, in printed circuit boards (PCBs). As elements of the PCBs shrink in size, demands on the location and accuracy of the laser machining increase.

SUMMARY OF THE INVENTION

In an embodiment of the present invention, a micromachining apparatus micromachines a location at a site, the site typically comprising an object, such as a conductive pad, embedded in an electrical circuit dielectric substrate of a printed circuit board (PCB). The apparatus comprises an optical system which illuminates the site with a radiation source, receives returning radiation from the site in response to the illumination, and conveys a micromachining beam from a beam source to the location. There is at least one common element in the optical system, such as a steerable mirror, which is used for all three functions. The radiation source and the beam source operate at different wavelengths. The beam source is typically a laser. The radiation source is typically a laser diode, although in some embodiments the radiation source may be a light emitting diode (LED).

An image sensor images the site using the returning radiation, and a processor calculates an actual position of the location to be micromachined, such as a center of the conductive pad, from the image. The processor generates a signal indicative of the actual position and uses the signal to align the micromachining beam with respect to the location, typically by adjusting the steerable mirror. The processor then operates the beam source to micromachine the location with the aligned beam. The beam may micromachine a hole of substantially any shape at the location. By using at least one common element for the functions of site illumination, site imaging, and beam transfer, the apparatus is able to provide local high intensity illumination to the site, so forming a good image of the site, and thus quickly and accurately align the micromachining beam with the location.

Typically, the apparatus is used to micromachine at multiple sites, each site having a different position, in the PCB. For each site, the processor may calculate nominal coordinates of a location to be micromachined, for example by analyzing a computer aided manufacturing (CAM) file of the circuit, and use the nominal coordinates to locate the substrate so that the site is nominally aligned with the beam and the illumination. At each site, the actual position for the beam is determined as described above. For at least some of the multiple sites, the realignment of the beam from site to site is performed by only operating the steerable mirror, thus enhancing the rate of micromachining of the PCB while maintaining the accurate beam alignment for all the sites.

In a disclosed embodiment, the image sensor acquires an image of the locality where the beam strikes the site, typically by the processor operating the beam source at a low power below an ablation threshold for the site. From the image of the site and the image of the locality where the beam strikes, the processor determines an offset to be applied to the beam so as to perform the beam alignment described above.

In some embodiments the radiation source may generate fluorescent radiation as the returning radiation, and the image sensor forms an image of the site and/or of a calibration target from the fluorescent radiation. The processor may adjust the wavelength and/or the power of the radiation source, typically according to fluorescent characteristics of the site. The adjustment may be made so that radiation from the radiation source penetrates the site and/or a region surrounding the site so that the image of the site from the fluorescent radiation is optimal. Using fluorescent radiation eliminates the problem of speckle if the radiation source is a laser.

In an alternative embodiment of the present invention, the radiation from the radiation source is linearly polarized, and the returning radiation is polarizeably analyzed. For a site comprising an embedded conductive object, returning radiation from the object is typically at least partially depolarized due to surface roughness of the object. The image sensor is thus able to form a well-contrasted image of the object in relation to its surroundings, for which the returning radiation is typically not depolarized.

In a further alternative embodiment of the present invention, the radiation source comprises a laser producing a coherent beam having a short coherence length, to substantially eliminate the effect of speckle. Alternatively or additionally, the radiation source comprises other speckle reducing and/or removing components, such as a plurality of optic fibers having different optical lengths.

In another disclosed embodiment, the radiation source is configured to illuminate the site using structured illumination, such as by forming an annular ring about an object at the site, and the substrate is diffusive. The combination of annular irradiation and a diffusive substrate effectively "backlights" the object.

There is therefore provided, according to an embodiment of the present invention, a method for micromachining a material, including:

configuring an optical system to provide illumination of an illumination wavelength to a site of the material via a given element of the optical system, the illumination generating returning radiation from the site;

configuring the optical system to receive the returning radiation via the given element, and to form an image of the site therefrom;

calculating an actual position of a location at the site from the image and outputting a signal indicative of the actual position of the location;

generating a beam of micromachining radiation having a micromachining wavelength different from the illumination wavelength;

positioning the beam to form an aligned beam with respect to the location in response to the signal; and conveying the aligned beam to the location via at least the given element of the optical system so as to perform a micromachining operation at the location.

Typically, the site includes an object embedded in one or more dielectric substrates, and providing illumination to the site may include providing structured illumination that illuminates only a region surrounding the object. The structured illumination may be formed with a diffractive element.

In an embodiment, providing illumination to the site includes selecting the illumination wavelength to be a wavelength at which the site fluoresces, and the returning radiation includes fluorescent radiation generated at the site in response to the provided illumination. The method may include filtering the fluorescent radiation to optimize the image of the site.

In an alternative embodiment, providing illumination to the site includes providing polarized illumination to the site, and forming the image of the site includes polarizeably analyzing the returning radiation from the site.

In some embodiments the given element includes a steerable mirror. The site may include a plurality of different sub-sites wherein micromachining is to be performed, and positioning the beam may include directing the beam to the plurality of different sub-sites by only steering the mirror.

In a further alternative embodiment the given element includes an optical element train which is configured to focus the beam and the illumination to the site.

The site may include a site area, and providing illumination to the site may include providing illumination to the site area and to a further area no larger than the site area and contiguous therewith. Typically, forming the image may include forming the image on an image sensor, and the illumination may have an intensity that generates the image on the image sensor in 3 milliseconds or less. Forming the image may include forming the image on an image sensor having an array of pixels, and selecting pixels for analysis of the image from the array in response to the area and the further area.

The method may also include determining a nominal position of the location prior to providing the illumination to the site, and providing the illumination in response to the nominal position.

In a yet further alternative embodiment, generating the beam of micromachining radiation includes:
   generating a low-power beam at a power for the beam below an ablation threshold for the site;
   conveying the low-power beam to the site; and
   determining an offset for the beam in response to an image of the low-power beam at the site.

Typically, positioning the beam includes positioning the beam in response to the offset, and conveying the positioned beam to the location includes setting the beam to have a power equal to or greater than the ablation threshold.

The method may include configuring the illumination wavelength to have a value for which the site is non-absorbing.

In an alternative disclosed embodiment the site includes an external surface, and providing illumination to the site includes illuminating the site with imaging radiation normal to the external surface.

Providing illumination to the site may include providing coherent imaging radiation at the site, the coherent imaging radiation have a coherence length equal to or less than twice a dimension of the site.

In a yet further alternative disclosed embodiment, calculating the actual position includes:
   providing a theoretical relationship in accordance with an expected image of the site;
   determining an actual relationship from the image; and
   fitting the actual relationship to the theoretical relationship.
   Forming the image of the site may include adjusting at least one of the illumination wavelength and a power of the illumination so as to vary a depth of penetration of the illumination at the site.

In one embodiment the site includes an object embedded in a diffusive layer, and the method includes compensating for a deviation resulting from the image being formed of the object embedded in the diffusive layer.

There is further provided, according to an embodiment of the present invention, a method for micromachining a material, including:
   operating a source to provide a beam of radiation to a site of the material including a location at an operational wavelength at which the material fluoresces, at a beam power insufficient for micromachining, so as to generate fluorescent radiation from the site;
   forming an image of the site in response to the fluorescent radiation;
   positioning the beam in relation to the location in response to the image; and
   operating the source to provide the beam of the radiation to the location at the operational wavelength and at a micromachining power sufficient to cause micromachining of the location.

Typically, operating the source at the beam power includes providing the beam of radiation to the site via a beam directing optical system, and forming the image includes transferring the fluorescent radiation via at least one element of the beam directing optical system to an image sensor. The method may include filtering the fluorescent radiation to optimize the image of the site.

There is further provided, according to an embodiment of the present invention, apparatus for micromachining a material, including:
   a radiation source which is configured to provide illumination of an illumination wavelength to a site of the material via a given element of an optical system, the illumination generating returning radiation from the site;
   an image sensor which is configured to receive the returning radiation via the given element, and to form an image of the site therefrom;
   a beam source which is configured to generate a beam of micromachining radiation having a micromachining wavelength different from the illumination wavelength; and
   a processor which is configured to calculate an actual position of a location at the site from the image and to output a signal indicative of the actual position of the location, to position the beam to form an aligned beam with respect to the location in response to the signal, and to operate the beam source so that the aligned beam is conveyed to the location via at least the given element of the optical system so as to perform a micromachining operation at the location.

The apparatus may include a set of filters configured to filter the fluorescent radiation, and the processor may be configured to select one of the set to optimize the image of the site.

The illumination may include polarized illumination, and the apparatus may include a polarization element enabling the image sensor to polarizeably analyze the returning radiation from the site.

The given element may include a steerable mirror.

Alternatively, the given element may include an optical element train which is configured to focus the beam and the illumination to the site.

There is further provided, according to an embodiment of the present invention, apparatus for micromachining a material, including:

a beam source which is configured to provide a beam of radiation to a site of the material including a location at an operational wavelength at which the material fluoresces, at a beam power insufficient for micromachining, so as to generate fluorescent radiation from the location;

an image sensor which is configured to form an image of the site in response to the fluorescent radiation; and a processor which is configured to position the beam in relation to the location in response to the image, and to operate the beam source to provide the beam of the radiation to the location at the operational wavelength and at a micromachining power sufficient to cause micromachining of the location.

The apparatus may include a beam directing optical system, and operating the beam source at the beam power may include providing the beam of radiation to the site via the beam directing optical system, and forming the image may include transferring the fluorescent radiation via at least one element of the beam directing optical system to the image sensor.

The apparatus may include a set of filters configured to filter the fluorescent radiation, and the processor may be configured to select one of the set to optimize the image of the site.

The present invention will be more fully understood from the following detailed description of the embodiments thereof, taken together with the drawings, a brief description of which follows.

DETAILED DESCRIPTION OF EMBODIMENTS

Figure 1:
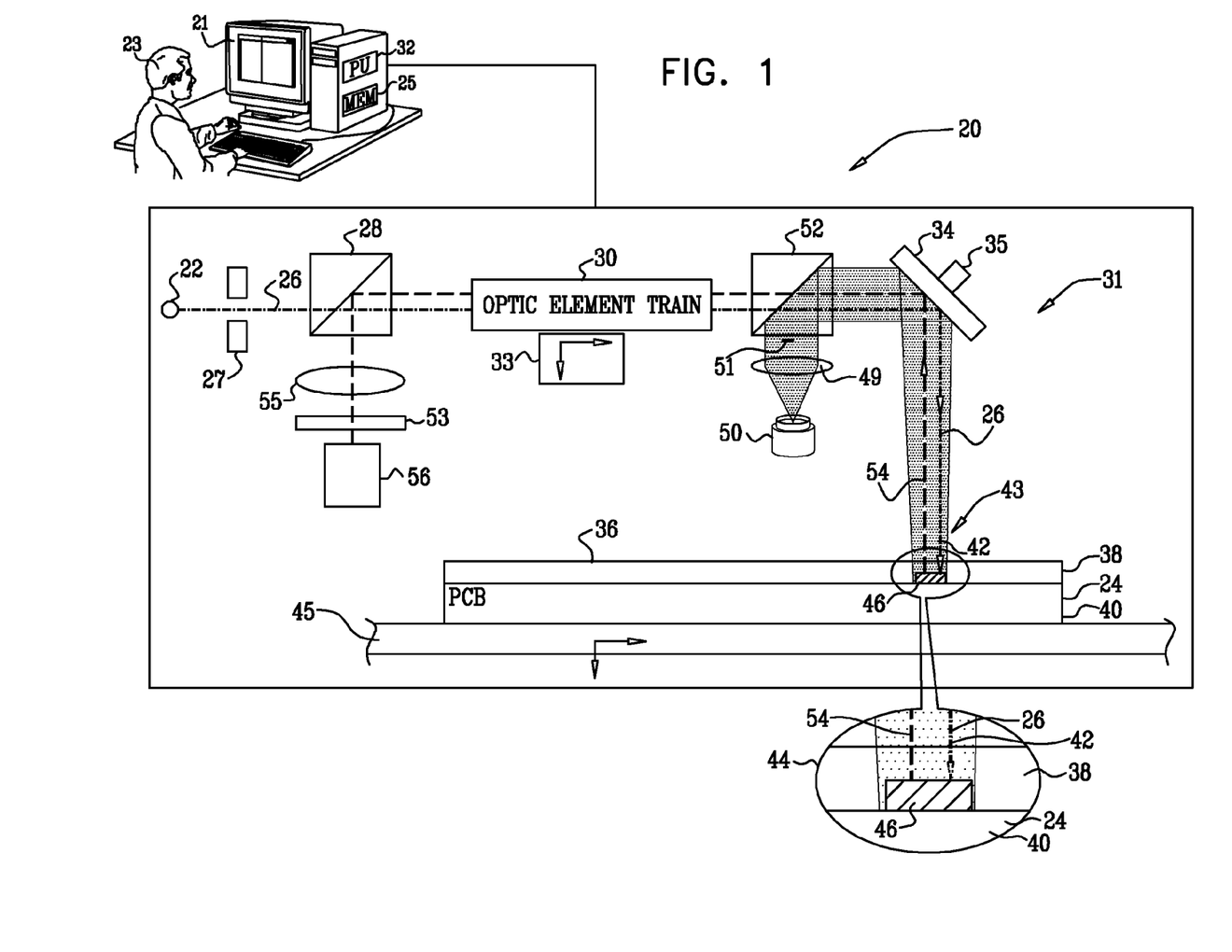
FIG. 1 is a schematic diagram of a beam alignment apparatus, according to an embodiment of the present invention.

Reference is now made to FIG. 1, which is a schematic diagram of a beam alignment apparatus 20, according to an embodiment of the present invention. Apparatus 20 is used to micromachine a site 43, which, by way of example, is assumed hereinbelow to be included in a printed circuit board (PCB) 24. Site 43 typically comprises dielectric substrate material, such as epoxy resin with glass beads and/or fibers, and/or conductive material such as copper pads or traces. Typically, although not necessarily, site 43 comprises conductive material embedded in dielectric substrate material. Apparatus 20 incorporates a beam source 22 which projects a radiation beam 26 via a collimator 27. Beam 26 is used to micromachine a hole at a location in site 43. In one embodiment, source 22 comprises an ultra-violet (UV) laser operative at a beam wavelength of approximately 350 nm. The UV laser may be operated as a short pulse laser, the pulses being of the order of femtoseconds in length, using the nonlinear interactions of the short pulses to cause ablation. In an alternative embodiment source 22 comprises a carbon dioxide laser operative at a beam wavelength of approximately 10 μm. However, apparatus 20 may use any suitable radiation source configurable to supply radiant energy that site 43 can absorb, in a form and of a level that may be used for micromachining. Hereinbelow, by way of example, source 22 is assumed to comprise a laser, so that beam 26 is a laser radiation beam.

A set 31 of optical components, comprising a beamsplitter 28, an optic element train 30, and a mirror 34, acts as a beam directing system to convey the beam onto the PCB. Typically, mirror 34 is a front surface mirror and beamsplitter 28 is a narrow-band dichroic cube beamsplitter that transmits the beam wavelength and reflects other wavelengths. Optic train 30 and PCB 24 are mounted on respective translation stages 33, 45. Mirror 34 is mounted on a beam steering stage 35, typically a galvanometer based steering stage, or a two axis fast beam steering stage such as is described in U.S. patent application Ser. No. 11/472,325. U.S. patent application Ser. No. 11/472,325 is assigned to the assignees of the present invention and is incorporated herein by reference. Laser beam 26 is transmitted, via the beamsplitter, to the optic element train which directs and focuses the beam.

Apparatus 20 is configured as a "post-scan" system, wherein there are no optical elements between mirror 34 and PCB 24. In this configuration, the mirror typically has a field of view (FOV) of approximately ±3°.

The following description, unless otherwise stated, is drawn to micromachining PCB 24 using one laser beam. However, it will be understood that embodiments of the present invention may use more than one laser beam operating substantially simultaneously.

An operator 23 operates apparatus 20 using a workstation 21 which comprises a memory 25 and a processing unit (PU) 32. PU 32 uses instructions stored in memory 25 to control individual elements of apparatus 20, such as laser 22 and the translation and beam steering stages. In addition to operating stages 33, 35, and 45, PU 32 may vary the focus of optic train 30 as a particular hole in site 43 is being micromachined. The hole is micromachined at a selected region 42 on a top surface 36 of PCB 24. An inset 44 shows site 43, which includes region 42 and an area surrounding the region, in more detail.

In some embodiments of the present invention, an object 46 is located beneath region 42, the object being embedded in PCB 24 so that there is a layer 38 of the PCB above the object, and a layer 40 below the object. Typically, other embedded objects are in proximity to object 46, and other layers may be comprised in PCB 24, but the other embedded objects and layers are not shown in FIG. 1 for clarity. Object 46 is typically part of an electrical circuit, and layers 38 and 40 act as a substrate on which the electrical circuit is formed. In one embodiment, object 46 is an approximately circular metal pad, having an approximate diameter of 100 μm. Typically, layers 38 and 40 are dielectrics, and are formed from filled epoxy resin. In some disclosed embodiments, layers 38 and 40 are assumed to be formed from one of the varieties of Ajinomoto Build-up Film (ABF), manufactured by Ajinomoto Fine-Techno Co., Inc, NJ, that are known in the art, and which are described below in reference to FIG. 2 and FIG. 3.

In one embodiment, layers 38 and 40 are implemented from ABF type GX3, and have a thickness of approximately 35 µm. However, it will be appreciated that layers 38 and 40 may be formed from any material suitable for construction of printed circuit boards. For example, layer 38 may comprise an ABF material and layer 40 may comprise FR4 material.

In order that PU 32 may align PCB 24, the PCB is illuminated by illumination from a radiation source 50, typically a laser diode, providing imaging radiation at an imaging radiation wavelength. In some embodiments, source 50 comprises a light emitting diode (LED), typically a high brightness LED. If source 50 comprises a laser diode, the source typically includes a speckle removing system, such as a bundle of fiber optics. Alternatively or additionally, the source may be selected to have a short coherence length, as is described in more detail below. Apparatus 20 includes a second dichroic beamsplitter 52, which is transparent to the beam wavelength and which acts as an approximately 50/50 beamsplitter at the imaging radiation wavelength. In some embodiments of the present invention, as described below, beamsplitter 52 comprises a polarizing beamsplitter. The imaging radiation is conveyed via a focusing lens system 49 through beamsplitter 52, so as to be generally coaxial with beam 26. The imaging radiation reflects from mirror 34 so that the imaging radiation at PCB 24 is substantially normal to surface 36. The imaging radiation arriving at surface 36 is configured to illuminate a relatively small area surrounding and contiguous with region 42, rather than an extended area of the surface, the area typically being of the order of four times the area of the site being micromachined. For example, for the exemplary 100 µm pad described above, focusing lens system 49 may be configured to provide imaging radiation in a circle having a diameter of the order of approximately 200 µm.

By configuring the imaging radiation to illuminate a relatively small area surrounding the location where the micromachining is to be performed, high intensity illuminating radiation may be efficiently provided to the area, so that good quality images of the area may be generated. By directing the imaging radiation via elements of apparatus 20 that are also used to direct micromachining beam 26 to the area being micromachined, as apparatus 20 is realigned to micromachine new areas the high intensity illuminating radiation automatically realigns to the new areas. In addition, as described below, returning radiation that is used for imaging also returns via common elements of apparatus 20 that direct beam 26 and the illuminating radiation, so that as apparatus 20 is realigned to micromachine new areas, the new areas are also automatically imaged. As is explained in more detail below, the above combination of features allows embodiments of the present invention to align beam 26 with its site substantially in real time, thus increasing the overall rate for micromachining PCB 24.

Returning radiation from site 43 is reflected by mirror 34 via beamsplitter 52 to optic train 30, as shown schematically by arrow 54, and transfers to beamsplitter 28 from the optic train. Train 30 directs the returning radiation, via beamsplitter 28 and a focusing lens 55, to an optical sensor 56, optionally via a filter system 53 which typically comprises a set of selectable filters, including band-pass and long-pass filters. Such a filter system may be utilized if site 43 generates fluorescent radiation, as is described below. For an object, such as object 46, that is present in site 43, sensor 56 is configured to provide signals to PU 32 according to the location of the object, and the processing unit uses the signals to align and orient beam 26 correctly with respect to PCB 24 and the object. The operation of sensor 56 is described in more detail with respect to FIGS. 5A, 5B, and 5C.

Figure 2:
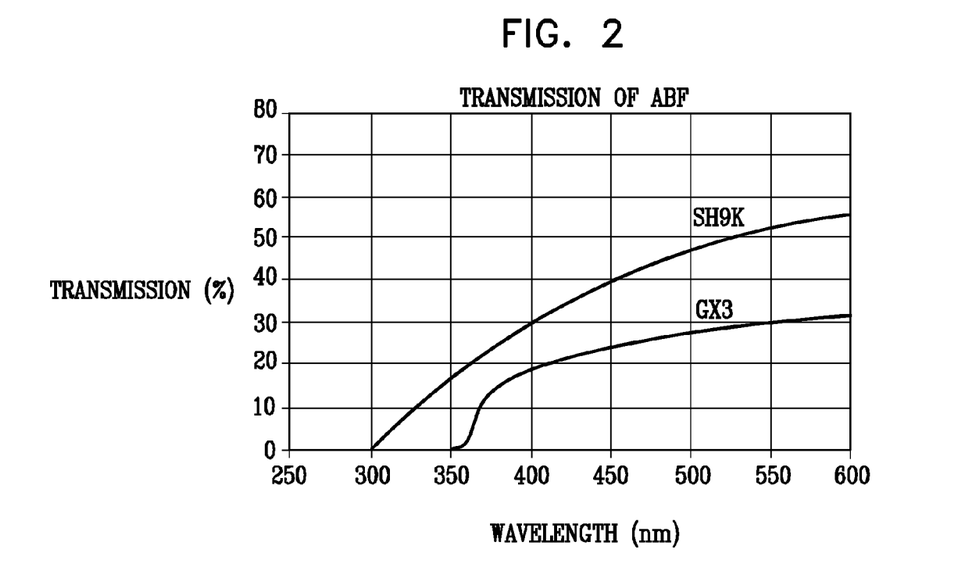
FIG. 2 is a graph of the percentage transmission of different types of Ajinomoto Build-up Film (ABF) resin.

In some embodiments, source 50 is used to generate fluorescent returning radiation from site 43, so that, inter alia, images formed from the returning radiation are inherently free of speckle. U.S. patent application Ser. No. 10/793,224, which is assigned to the assignee of the present invention and which is incorporated herein by reference, describes generation of fluorescent images. In such cases, source 50 may advantageously comprise a laser diode operative at approximately 405 nm, and typically there may be no need for a speckle removing system. Furthermore, beamsplitter 52 may advantageously be configured as a dichroic beamsplitter, reflecting radiation from source 50, and transmitting beam 26 and the fluorescent returning radiation. Advantageously, PU 32 may be configured to adjust the wavelength and/or the power of the imaging radiation generated by source 50. By adjusting the wavelength and/or power, the effective depth of penetration of the imaging radiation into site 43 may be varied, so that the image generated by the fluorescent radiation may be optimized. If site 43 incorporates an object that does not fluoresce, such as a metal pad, generating an image with fluorescent radiation enhances the contrast of the image. Since, as is explained below, site 43 typically comprises layers having different fluorescent properties, PU 32 and/or operator 23 may choose filters from filter set 53 to optimize the image In some embodiments source 50 is selected to have an operating wavelength or range of wavelengths to which the PCB is substantially transparent, such as the wavelengths given below in reference to FIG. 2. In this case, typically for objects 46 that are at least partially specular, the objects may be imaged as bright objects against a relatively dark background. This type of "bright field" imaging may be generated when relatively long source wavelengths, such as are given below in reference to FIG. 2, are used in conjunction with materials, such as SH9K ABF resin, GX3 ABF resin, or GX13 ABF resin, that are relatively transparent to these wavelengths.

Typically, PU 32 uses translation stage 45 to perform coarse alignment for PCB 24, and stages 33 and 35 for fine alignment, so that region 42 is at a desired position on surface 36, and so that beam 26 is in a desired orientation with respect to the surface. However, any other convenient combination of operations of translation stages 33, 45, and beam steering stage 35, may be used to position and orient beam 26.

In order to micromachine a hole in PCB 24 with beam 26, the material machined needs to be at least partially effectively absorbing, so that energy of the beam is absorbed. The effective absorption may be caused by absorption of the beam by the PCB resin at the beam wavelength, or by objects incorporated in the resin, for example, glass particles or fibers, or by objects such as object 46 embedded in the PCB. Alternatively or additionally, in the case of short pulse lasers referred to above, the effective absorption to the beam may be caused by nonlinear interactions of the short pulses with the PCB resin or embedded object. In general, since the micromachining operates by ablation of portions of the PCB, the efficiency of micromachining increases as the effective absorption of the beam increases.

A number of other factors may influence the ability of apparatus 20 to efficiently micromachine in PCB 24:

The required effective absorption of the PCB portions to be micromachined at the beam wavelength may limit effective imaging at the beam wavelength of objects beneath surface 36, such as object 46.

Some of the optical elements of apparatus 20 convey both the beam radiation from source 22 and the imaging radiation from source 50. In addition, the optical elements may convey fluorescent radiation if it is generated. The three radiations have differing wavelengths, and some of the wavelengths may be very different from each other. In such cases optical elements of apparatus 20 may be advantageously selected to comprise reflective elements, refractive elements, or a combination of the two types of elements, and/or other elements such as diffractive elements so as to correctly transfer the differing wavelengths. The selection of elements will be apparent to those having ordinary skill in the art.

There are practical limits to the wavelength that may be selected for the beam, as well as for the wavelength, or range of wavelengths, that may be selected for the imaging radiation and for fluorescent radiation, if it is used. The choice of beam and imaging radiation wavelengths is a function of these and other factors, including optical characteristics of the constituents of PCB 24 and object 46. As a consequence, in some embodiments of the present invention the beam wavelength and the imaging radiation wavelength are selected to be approximately the same. For these embodiments, the imaging radiation wavelength is separated from the beam wavelength by about 50 nm or less. In other embodiments the two wavelengths are selected to be different, so that the imaging radiation wavelength is separated from the beam wavelength by about 100 nm or more. For the case of fluorescent imaging, the imaging radiation wavelength is chosen so as to generate fluorescence, and there is inherently partial absorption of the imaging radiation by the PCB resin.

Apparatus 20 may be used to micromachine multiple holes in PCB 24, the holes typically being used for micro vias and/or blind vias. The steps involved in micromachining multiple holes are to align beam 26 with region 42, micromachine the hole through the region, and realign the beam on a new site having a region to be micromachined. This process is repeated iteratively. For the process to be efficient, the alignment and realignment of the beam should be performed as quickly as possible. Alternatively or additionally, multiple sets of apparatus 20 may be configured to micromachine multiple holes substantially simultaneously. In one embodiment of the present invention, 18 sets of apparatus 20 are operated simultaneously on the PCB.

In some embodiments of the present invention, apparatus 20 comprises an element 5 1. The function of element 51 is described below, in reference to FIG. 8.

FIG. 2 is a schematic graph of the percentage transmission of different types of ABF resin for a resin thickness of 45 μm at different wavelengths.

Inspection of the graph shows that at a wavelength of approximately 350 nm, corresponding to that provided by laser 22 if the laser is a UV laser, SH9K ABF resin transmits approximately 20%, whereas GX3 ABF resin is highly absorbing. Thus, if layer 38 is SH9K ABF resin, source 50 may have approximately the same wavelength as laser 22, and produce returning radiation from object 46. If layer 38 comprises GX3 ABF resin, then to achieve the same, or more, returning radiation as for SH9K, the source wavelength should be approximately 430 nm or more. In addition to the transmission factor given by the graph of FIG. 2, other factors affecting imaging of PCB and object 46 include diffusion of the illuminating radiation, which varies due to the size and density of the glass beads used to fill the epoxy resin comprising layers 38 and 40.

The inventors have found that both types of resin are substantially transparent at near infra-red wavelengths, of the order of 800 nm or more. The inventors have also found that good images of embedded objects such as object 46 are produced if source 50 operates at these wavelengths, irregardless of the diffusion caused by embedded beads in layers 38 and 40.

Figure 3:
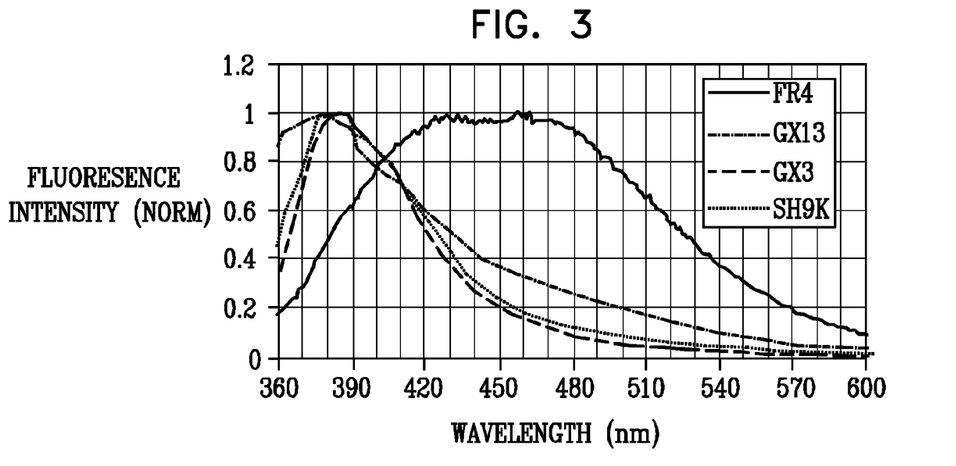
FIG. 3 is a schematic graph of the normalized fluorescence of different types of ABF resin and FR4 resin.

FIG. 3 is a schematic graph of fluorescence of different types of resin. The graphs, for ABF resins GX3, SH9K and GX13, and for an FR4 material, plot a normalized fluorescence intensity vs. the fluorescent wavelength for each of the resin materials. The graphs were generated for an excitation wavelength of approximately 300 nm, but the inventors have verified that generally similar graphs occur for other excitation wavelengths, including the wavelength of 350 nm for a UV laser exemplified above. Some embodiments of the present invention use the property of fluorescence illustrated by the graphs of FIG. 3 in operating apparatus 20. For example, if layer 40 (FIG. 1) comprises FR4 resin, and layer 38 comprises GX3 resin, the two layers may be well distinguished by using a band-pass filter operating at approximately 450 nm, or a long-pass filter having a cut-off at approximately the same wavelength. To observe fluorescence from both layers a shorter wave band-pass or long-pass filter may be used.

Figure 4:
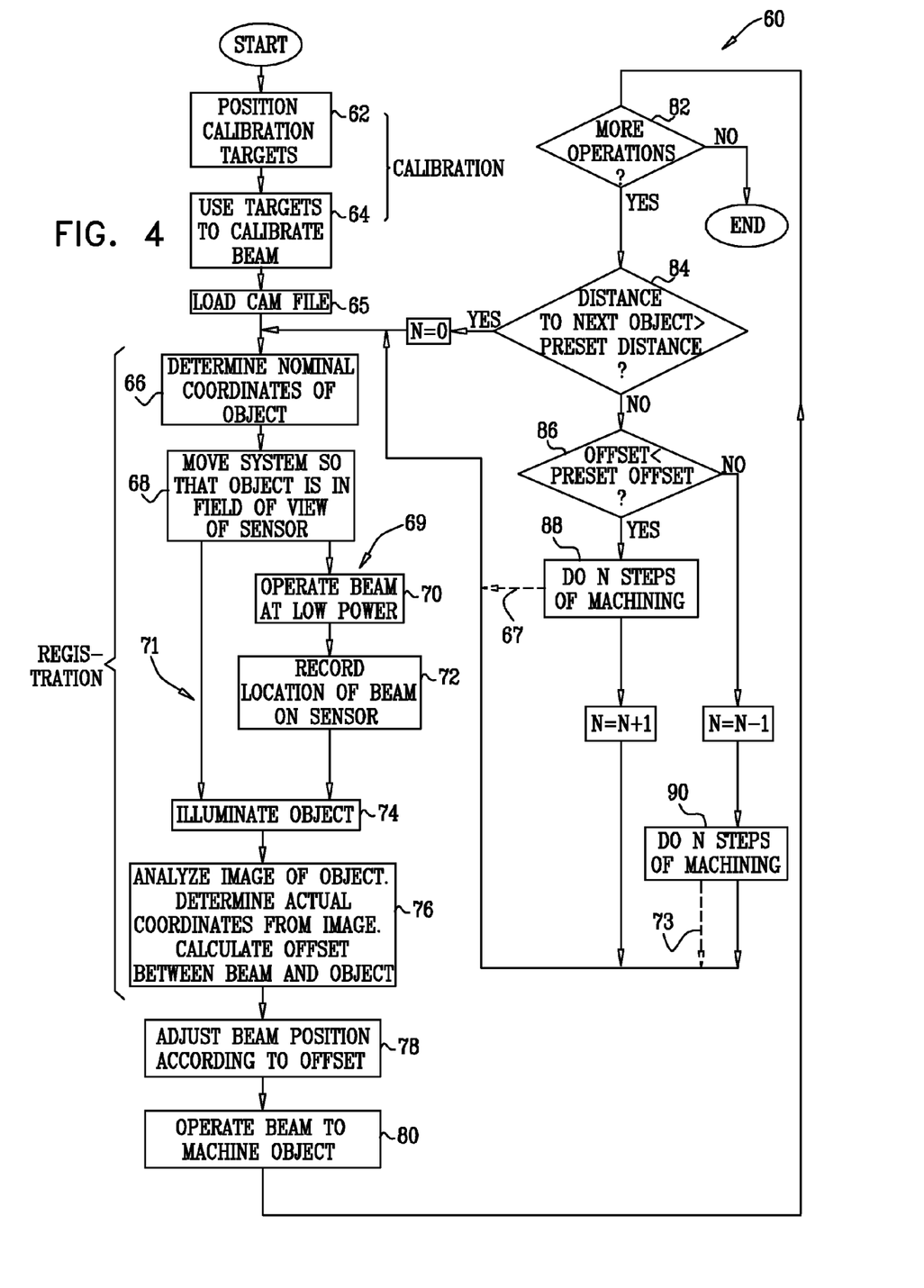
FIG. 4 is a flowchart showing steps performed to operate the beam alignment apparatus, according to an embodiment of the present invention.

FIG. 4 is a flowchart 60 showing steps performed in operating apparatus 20, according to an embodiment of the present invention.

Prior to micromachining with apparatus 20, the apparatus is initially calibrated with respect to PCB 24. The initial calibration may be by marking a panel such as a specific calibration panel (different from PCB 24), imaging the marks with apparatus 20, and from the imaged marks determining a calibration offset for the apparatus. In some embodiments, a part of PCB 24 may be marked and the marks used for the calibration.

Alternatively or additionally, the property of fluorescence illustrated by the graphs of FIG. 3 may be advantageously used for registration of apparatus 20, as is described in more detail below.

The following description of the steps of flowchart 60 describes a calibration process and a micromachining process.

In a first calibration step 62, operator 23 positions a special calibration panel, or PCB 24 if the PCB is to be used for calibration, on stage 45. The operator provides apparatus 20 with calibration target coordinates, typically for 2 to 4 targets, as well as shapes corresponding to the targets, in the calibration panel or in PCB 24. The operator may provide the target coordinates and shapes from a computer aided manufacturing (CAM) file, or they may be input directly by the operator. As is described above, the targets may be configured to be non-destructive or destructive. Alternatively, the calibration panel or PCB 24 may be positioned mechanically, typically using reference pins, corners, or other mechanical reference regions of the panel or PCB.

In a second calibration step 64, the operator operates a registration system of apparatus 20 so as to illuminate and locate the calibration targets. The illumination may be from source 50, which, as described above, may advantageously have its imaging radiation wavelength selected so that the returning radiation is fluorescent radiation. As is also described above, PU 32 may adjust the wavelength and/or the power of source 50 to optimize the image generated.

Alternatively or additionally, if fluorescence of the calibration targets is used, a region including the targets may be illuminated by operating laser 22 at a power below an ablation threshold power for the PCB. In this case the region may be illuminated by operating laser 22 in an "area illumination" mode, typically by defocusing beam 26 with optic train 30. Alternatively, the area illumination mode may be implemented by scanning mirror 34 and thus the laser beam using beam steering stage 35. The calibration targets are imaged on sensor 56, and PU 32 uses the target images formed on the sensor to calibrate apparatus 20. If fluorescence is used, PU 32 and/or operator 23 may select one of the filters in set 53 to optimize the image produced, typically in the case that layers 38 and 40 comprise different resins such as are described above, and as is exemplified in the description of FIG. 3.

The following steps assume that PCB 24 has been used for the calibration, and that the PCB is in place in apparatus 20. Also in the following steps, object 46 is assumed, by way of example, to be an isolated approximately circular pad, and a hole is to be micromachined vertically to surface 36, through the center of the pad. Those having ordinary skill in the art will be able to adapt the description of the steps of the flow-chart, mutatis mutandis, for other types of object 46, such as a circular pad connected to a rectangular conductor, or to an array of connected circular pads.

In a first micromachining step 65, operator 23 loads a CAM file, corresponding to an electrical circuit implemented in PCB 24, into memory 25.

In a second micromachining step 66, PU 32 uses the CAM file to determine a shape, and nominal coordinates of the shape, wherein a hole is to be micromachined. In the following description, it is assumed that a hole is to be micromachined in the center of object 46, so that the nominal coordinates may be those of object 46, or of site 43 comprising the object. Alternatively, the nominal coordinates and shape of object 46 may be found from analysis of an image of the electrical circuit, the analysis being performed by operator 23 and/or PU 32.

In a third micromachining step 68, PU 32 uses a signal corresponding to the nominal coordinates to provide coarse adjustment control signals to the motion stages holding PCB 24, train 30, and/or mirror 34, so that object 46 moves into the field of view of sensor 56. The positioning may be performed completely automatically by the processing unit. Alternatively, operator 23 may at least partially implement the positioning, typically by providing the nominal coordinates to PU 32.

From step 68, PU 32 follows one of two possible paths. A first path 69 leads to an object illumination step 74 via beam registration steps 70 and 72. A second path 71 leads directly to an object illumination step 74. First path 69 is followed by PU 32 when flowchart 60 is first operated, and periodically afterwards, so that the beam registration performed in steps 70 and 72 is not performed for each object that is micromachined. Rather, the beam registration is performed intermittently every t seconds, where t is a parameter chosen by operator 23, and is typically approximately of the order of 10.

In path 69, in first beam registration step 70, laser 22 is operated at low power, below an ablation threshold, so as to impinge on site 43. The laser beam typically causes fluorescence where it impinges on site 43, herein assumed to be region 42, in which case the returning fluorescent radiation is focused at sensor 56, to form an image at the sensor of region 42. Alternatively, rather than using the fluorescence of the PCB, an ablative calibration board may have been previously added to site 43.

In path 69, in second beam registration step 72, PU 32 records the location of the laser beam on sensor 56.

In an object illumination step 74, PU 32 switches laser 22 off, and operates source 50 to illuminate object 46. Alternatively or additionally, in step 74 PU 32 may maintain laser 22 at a low power and/or in the area illumination mode described above. Typically, PU 32 uses generated returning fluorescent radiation from the PCB, in the vicinity of object 46, to produce the image described in the following step 76. The fluorescent radiation may be generated from the radiation of laser 22 and/or source 50. The image may be formed solely from the returning fluorescent radiation, or together with returning radiation at the wavelength of source 50. Typically, such as for the example described above of layers 38 and 40 comprising different resin types (such as ABF and FR4), in the case of returning fluorescent radiation PU 32 selects a filter from set 53 to optimize the image.

In an object record step 76, PU 32 records an image of the object that is generated at sensor 56. PU 32 analyzes the signal levels from sensor 56 to determine a signal corresponding to actual coordinates for the center. An example of the analysis is described in reference to FIGS. 5B and 5C. If path 69 has been followed, the processing unit records and determines an offset between the actual coordinates of the center of the circular pad and the beam position found in step 72. If path 71 has been followed, the processing unit uses the offset found in the most recent implementation of path 69.

In a motion step 78, PU 32 uses the offset determined in step 76 to adjust the beam position in relation to the center of object 46. Typically, the adjustment is made by operating beam steering stage 35 to correctly align mirror 34.

In an operate laser step 80, PU 32 switches the power of source 22 above the ablation threshold so that the beam ablates layer 38 and object 46, and thus micromachines a hole at the actual coordinates of the center of object 46. In some embodiments, during the micromachining, the processing unit may also use optic element train 30 to change the focus of beam 26 as the micromachining proceeds.

In a first decision 82, PU 32 checks if there are further micromachining operations to be performed on PCB 24 at other sites of the PCB. If there are no more operations, flowchart 60 ends. If there are more operations, herein assumed to be machining holes in the center of objects substantially similar to object 46, flowchart 60 continues to a second decision 84.

In second decision 84, PU 32 determines if the distance from object 46 to the nominal location of a next object to be machined is greater than a preset distance, typically of the order of 10 mm. If the distance is greater than the preset distance, a counter N is set to 0, and the flowchart returns to step 66, to machine the next object.

If the distance is less than or equal to the preset distance, then in a third decision 86 PU 32 checks if the offset recorded in step 76 is less than a preset value. If the offset is less than the preset value, then in a step 88 PU 32 operates apparatus 20 by performing steps 78 and 80 for N next objects, where N is the counter referred to above, and where N is set to a predetermined value, typically approximately 10. Operator 23 may set the predetermined value of N at the loading of the CAM file in step 65.

While performing step 88, PU 32 checks after each machining operation if the distance between objects exceeds the preset distance, in which case the flowchart returns, as shown by a broken line 67 in the flowchart, to step 66. If the preset distance is not exceeded as the N objects are machined, PU 32 completes machining the N objects, increments N, and then returns the flowchart to step 66.

If in decision 86 the offset is greater than or equal to the preset value, then PU 32 decrements N, to a minimum value of 0. In a step 90 PU 32 operates the apparatus by performing steps 78 and 80 for N (the decremented value) next objects. While performing step 90, PU 32 checks after each machining operation if the distance between objects exceeds the preset distance, in which case the flowchart returns, as shown by a broken line 73 in the flowchart, to step 66. If the preset distance is not exceeded as the N objects are machined, PU 32 completes machining the N objects and then returns the flowchart to step 66.

Decision step 84 allows operator 23 to configure apparatus 20 so that objects within a preset distance of an object wherein registration steps 66-76 have been performed may be machined without performing the registration steps. In other words, the offset determined for a given object is used to position the beam for a group of objects close to the given object.

Decision step 86 allows the operator to configure the apparatus so that the size of the offset found in step 76 determines how many objects are in the group referred to above. Thus, if the determined offset is below the preset offset, the value of N, the number of objects in the group, is incremented for the next group of objects to be machined. If the determined offset is greater than the preset offset, the value of N is decremented for the next group of objects to be machined.

The operator typically inputs values of the preset distance and preset offset in step 65.

The description above applies to micromachining a circular hole vertical to surface 36, through the center of a circular pad. Apparatus 20 may also perform other micromachining operations, such as micromachining a hole non-vertically, and/or micromachining a non-circular hole, for example a hole in the shape of a slit, and/or micromachining a hole at a position different from the position corresponding to the actual coordinates determined in flowchart 60. It will also be understood that the micromachining may be applied to form a hole that completely penetrates the PCB, or a hole that does not completely penetrate the PCB. Those having ordinary skill in the art will be able to adapt the description above for such other micromachining operations, typically by the processing unit implementing, in steps 78 and 80, further operations of translation stage 33, translation stage 45, and/or beam steering stage 35.

Typically, the coarse alignment corresponding to step 68, if performed automatically, takes approximately 1-3 ms from a previously micromachined hole. The shorter times typically apply if beam steering stage 35 (FIG. 1) is galvanometer based, the longer times typically apply if the stage is a two-axis scanning system. Advantageously, the fine alignment procedure described above in step 78 takes less than approximately 1 ms. The times are achieved because of, inter alia, the high intensity imaging radiation that is directed to each site that is micromachined.

The inventors have found that, because of these times, substantially no time is lost in application of flowchart 60 to machining PCBs, compared to prior art systems that do not apply the steps of the flowchart for such machining. Furthermore, steps such as decision steps 84 and 86 may be performed during machining of the PCB. Thus, flowchart 60 may be implemented to operate substantially in real time. By operating at the times stated, deleterious relatively long term effects, such as thermal drift, may be eliminated. Furthermore, by only performing registration steps 70 and 72 intermittently, as described above, overall operation time is reduced without affecting the accuracy of the micromachining.

Figure 5A:
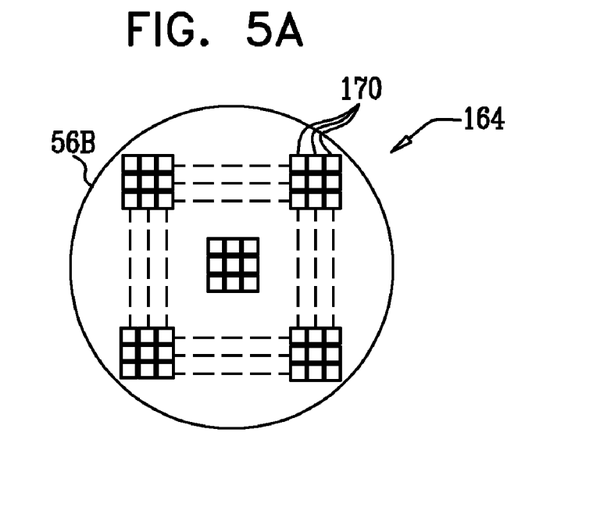
FIG. 5A shows a schematic diagram of a surface of an optical sensor, according to an embodiment of the present invention.

FIG. 5A shows a schematic diagram of a surface of optical sensor 56 that may be used in apparatus 20, according to an embodiment of the present invention. Typically, in order to generate alignment signals in the alignment times given above, sensor 56 uses complementary metal oxide semiconductor (CMOS) technology. Alternatively, sensors 56 may comprise one or more CCDs (charge coupled devices), or other suitable sensing devices.

A diagram 164 illustrates the surface of sensor 56. Sensor 56 typically comprises a rectangular array of detector elements 170. Some examples of suitable image sensors are described hereinbelow. Micron Technology, Inc of Boise, Id., provide an MTM001 CMOS 1.3 Mpixel rectangular array sensor, which the inventors have found is suitable. The number of elements of the sensor that are addressed may be restricted using a programmable area of interest (AOI), allowing the array to be used for short acquisition times of the order of 1-3 ms. Hamamatsu Photonics K.K., of Japan, provide a 256×256 detector element S9132 array which may be operated as two one-dimensional arrays, giving summed outputs described in more detail below. Other arrays which are suitable for use as sensor 56 will be familiar to those having ordinary skill in the art.

Figure 5B:
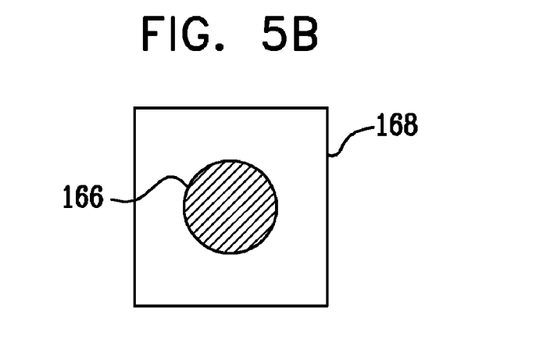
FIGS. 5B and 5C show schematic diagrams of images on the sensor of FIG. 5A, according to an embodiment of the present invention.
Figure 5C:
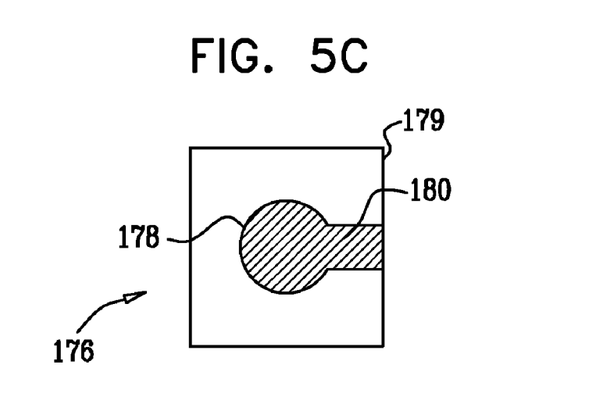

PU 32 may advantageously use signals from elements 170 to accurately determine a particular position with respect to object 46. FIGS. 5B and 5C show examples of images of object 46. By way of example, object 46 is assumed to comprise a circular pad, and the center of the circular pad is to be micromachined. In FIG. 5B, object 46 comprises an isolated approximately circular pad, generating an image 166. In FIG. 5C, object 46 comprises an approximately circular pad connected to a rectangular conductor, generating an image 176 comprised of a circular portion 178 connected to a rectangular portion 180.

If sensor 56 comprises a rectangular array of individual pixels such as the Micron array referenced above, then for image 166 PU 32 may reduce the number of pixels to be analyzed to a rectangular set of pixels 168 surrounding image 166, the reduction of pixel numbers reducing the acquisition time of the image. PU 32 may then fit all the imaged pixels to a circle, typically by using an edge-detection algorithm, to identify the center of image 166 to sub-pixel accuracy.

For example, by using 100×100 pixels of the 1.3 Mpixels, the image acquisition time may be improved by a factor of nearly 100 compared with the nominal frame rate of 30 Hz, providing a sub-millisecond acquisition time. Such a short acquisition time requires a high image illumination intensity, as is provided by the directed site illumination from source 50 via mirror 34 (FIG. 1).

For image 176, PU 32 may reduce the number of pixels to be analyzed to a rectangular set of pixels 179 surrounding portion 178, possibly cutting off some of the pixels of rectangular portion 180. By using an edge-detection algorithm, PU 32 may then fit imaged pixels forming a non-linear edge to a circle, to identify the center of circular portion 178 to sub-pixel accuracy. Alternatively, PU 32 may use an edge-detection algorithm to fit all the pixels to an expected theoretical edge generated by a circle intersected by two parallel lines on one side of the circle.

Typically, pixels selected for analysis by PU 32 do not need to be simple rectangular arrays. For example, the imaged site may comprise a small circular pad attached to a large circular pad, in which case the pixels selected by PU 32 may be configured as a generally irregular set of pixels chosen to just encompass the site.

Sensor 56 may comprise an array which may not give an output for each pixel of the array, such as the Hamamatsu array referenced above. In this case PU 32 may apply curve fitting to the summed outputs of the array, to find the centers of images 166 and 178.

Figure 6:
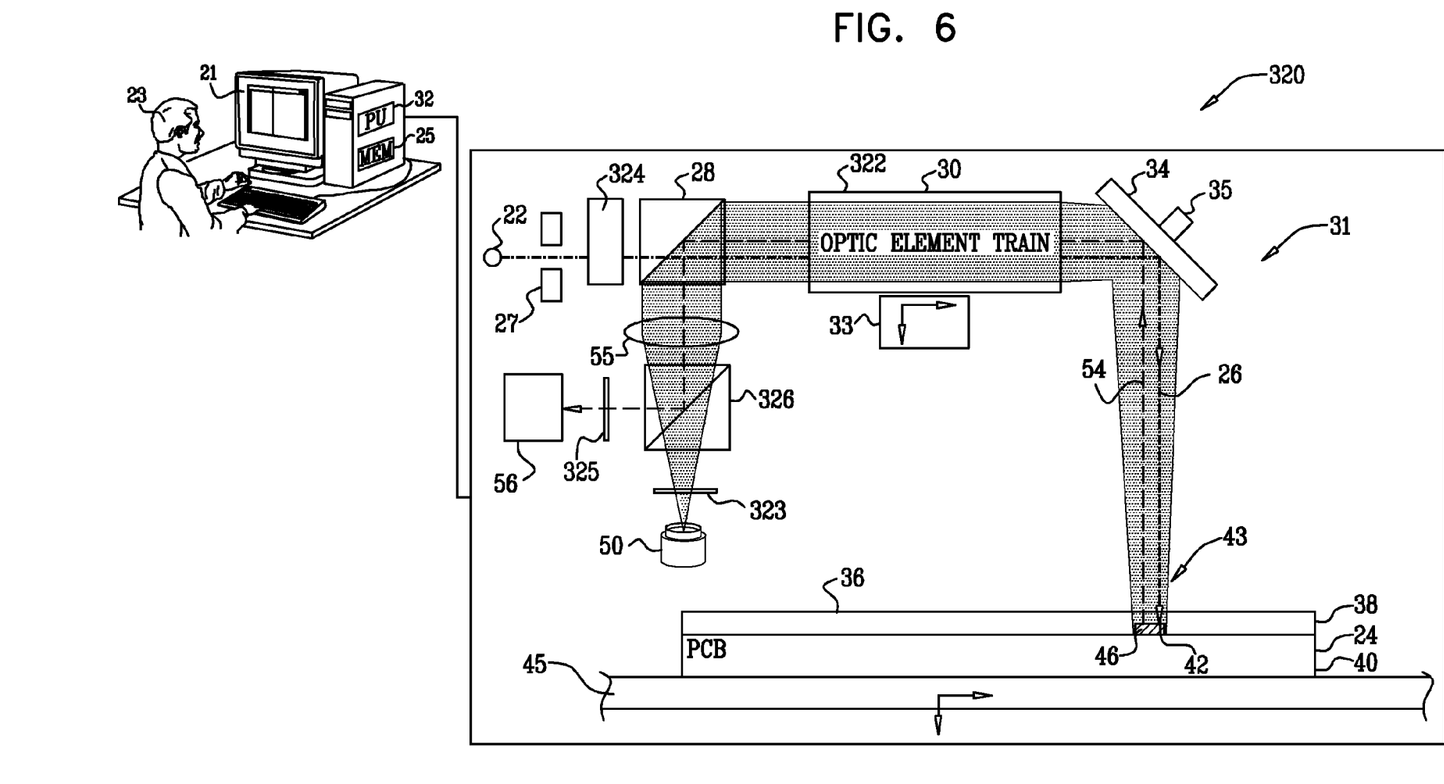
FIG. 6 is a schematic diagram of a beam alignment apparatus, according to an alternative embodiment of the present invention.

FIG. 6 is a schematic diagram of a beam alignment apparatus 320, according to an alternative embodiment of the present invention. Apart from the differences described below, the operation of apparatus 320 is generally similar to that of apparatus 20 (FIG. 1), and elements indicated by the same reference numerals in apparatus 20 and 320 are generally similar in construction and in operation.

Apparatus 320 includes a beamsplitter 326, and beamsplitter 52 is removed. Beamsplitter 326 is configured to transmit imaging radiation from source 50, and to reflect radiation returning from site 43 to sensor 56. If the returning radiation has the same wavelength as that of source 50, beamsplitter 326 may be a 50/50 beamsplitter. If the returning radiation is fluorescent radiation, beamsplitter 326 may be configured as a dichroic beamsplitter. Alternatively, as described below, beamsplitter 326 may be a polarizing beamsplitter.

In apparatus 320, optical element train 30 is separated into two sets of optics. A first set 324 typically comprises movable optic elements that may be used to change the magnification of the beam from source 22. A second set 322 typically comprises fixed optical elements. By dividing train 30 into the two sets, the magnification of the beam from source 22 may be adjusted without affecting the illumination and imaging path between beamsplitter 28 and mirror 34.

Elements 323 and 325 in apparatus 320 are described below.

If the normal imaging illumination provided in apparatus 320 is generally uniform over site 43, i.e., if there is little or no structure to the illumination, the resulting image of a specular object 46 is typically a bright image of the object against a dark background image of a region surrounding the object, and the two images have good contrast.

Consideration of apparatus 20 and 320 shows that optical elements such as steerable mirror 34 and optic train 30 may convey at least two differing wavelengths, i.e., the beam wavelength of beam 26 and the imaging radiation wavelength of source 50. If fluorescence is used, then the optical elements may convey three differing wavelengths, i.e., the beam wavelength, the imaging radiation wavelength, and the fluorescent wavelength. Configuring the same elements to convey two or three different wavelengths significantly reduces the number of optic elements that may be needed if separate sets of elements are used for the differing wavelengths.

Figure 7:
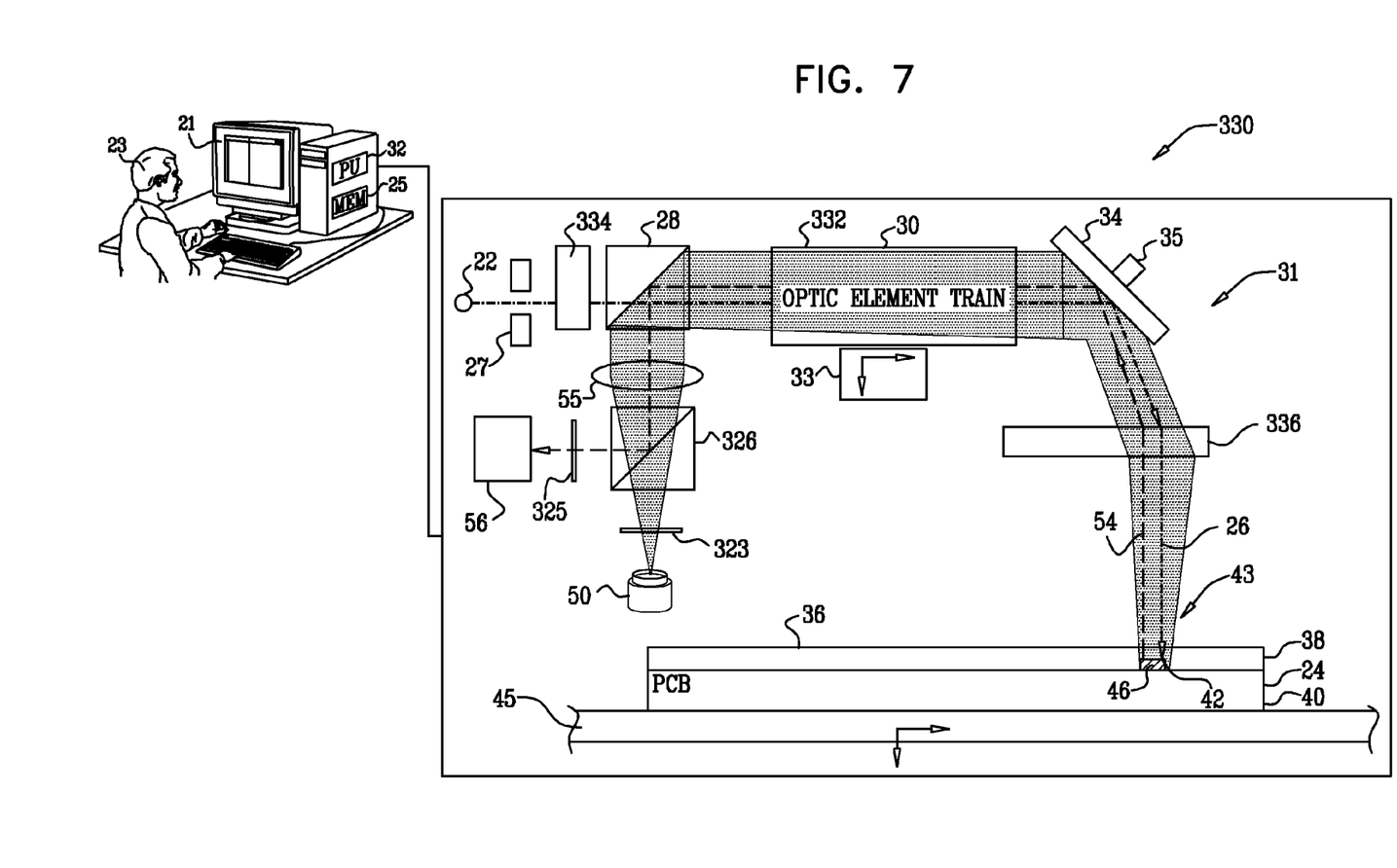
FIG. 7 is a schematic diagram of a beam alignment apparatus, according to a further alternative embodiment of the present invention.

FIG. 7 is a schematic diagram of a beam alignment apparatus 330, according to a further alternative embodiment of the present invention. Apart from the differences described below, the operation of apparatus 330 is generally similar to that of apparatus 20 (FIG. 1) and apparatus 320 (FIG. 7), and elements indicated by the same reference numerals in apparatus 20, 320 and 330 are generally similar in construction and in operation.

Apparatus 330 comprises a lens system 336 between mirror 34 and site 43. Lens system 336 typically comprises a telecentric lens, which allows mirror 34 to have an FOV of approximately ±20°. Adding the lens system configures apparatus 330 as a "pre-scan" system. The larger FOV of the mirror, compared with the post-scan systems described above, allows the mirror to both project beam 26 onto a larger area of PCB 24 and to image the area.

Optical sets 324 and 322 are typically respectively reconfigured to a first set 334 comprising movable elements, and a second set 332 comprising fixed elements, set 334 and set 332 being selected to accommodate lens system 336.

The descriptions above for apparatus 20, 320, and 330 have assumed that the imaging illumination is generally normal to surface 36, and that it is generally unstructured. In some embodiments of the present invention, as described below, the imaging illumination may also be configured so that the illumination has structure, as described below.

Figure 8:
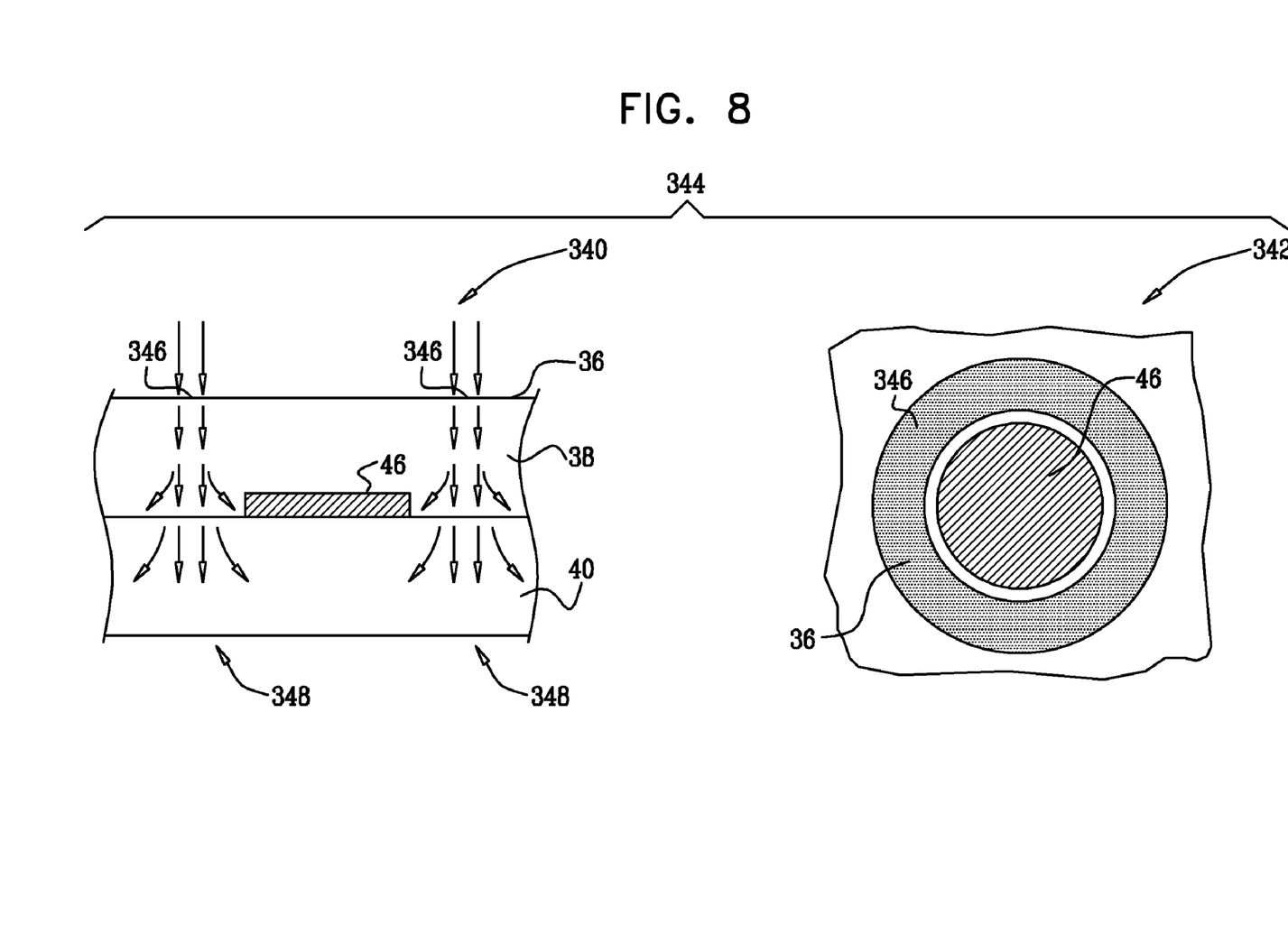
FIG. 8 illustrates an imaging illumination configuration provided by sources in the apparatus of FIG. 1, FIG. 6, and/or FIG. 7, according to an embodiment of the present invention.

FIG. 8 illustrates an imaging radiation configuration 344 provided by source 50, according to an embodiment of the present invention. A cross-section 340 and a top-view 342 of PCB 24 are shown for radiation configuration 344. In configuration 344 the imaging radiation on surface 36 is structured, for example as a generally annular ring 346 of imaging radiation. The imaging radiation penetrates layers 38 and 40, and is also partially scattered within the layers because of diffusion within the layers, due, inter alia, to the fill material incorporated in the layers. The combination of penetration and partial scattering effectively "backlights" object 46, as shown schematically by arrows 348, so producing a high contrast image at sensor 56. The high contrast image is generated irregardless of whether object 46 is specular or non-specular. Furthermore, the high contrast image produced by the backlighting effectively compensates for blurring of the image that may be caused by the radiation diffusion within the layers. Without using the backlighting effect, the image blurring may cause deviations in measured position of the image.

Radiation configuration 344 may be advantageously provided in apparatus 20 by positioning an element 51 (FIG. 1), typically a stop, between lens 49 and beamsplitter 52. Although not illustrated in the interests of clarity, configuration 344 may also be provided in apparatus 320 by positioning an appropriate stop between lens 55 and beamsplitter 28. Other methods for producing an annular ring of radiation in apparatus 20, 320, and 330, such as by using diffractive elements designed to give structured illumination, will be apparent to those having ordinary skill in the art, and are assumed to be comprised within the scope of the present invention. For example, element 51 may comprise such a diffractive element. Other forms of structured illumination may be provided by source 50, the illumination typically being structured according to the site being imaged. For example, a rectangle of illumination may be used to illuminate a region around a generally linear trace. All such forms of structured illumination are assumed to be comprised within the scope of the present invention.

For configuration 344, source 50 may be selected to be a laser emitter with very short coherence length, so that there is substantially no speckle. The inventors have found that lasers with a coherence length of the order of 1-2 times a dimension of an object being machined, such as the diameter of a circular pad, are suitable.

Referring back to FIG. 6, an alternative radiation configuration uses polarized illuminating radiation. As illustrated in FIG. 6, a polarizer 323 may be positioned after source 50, and an analyzer 325 is positioned before sensor 56. Alternatively, since source 50 typically provides polarized radiation, there may be no need for polarizer 323. The orientation of polarizer 323, or of source 50 if its radiation is polarized, and of analyzer 325, may be controlled by PU 32. Alternatively, the orientations may be preset to generally fixed values by operator 23. Reflections from surface 36, and from intermediate surfaces of PCB 24 such as the interface between layer 38 and layer 40, have practically the same polarization as the incoming polarized radiation at low incident angles. The returning scattered radiation from layers 38 and 40 is relatively weak and is mainly polarized in the same direction as the incoming polarized radiation. However, if object 46 has even a partially roughened metallic surface, as is typically the case so as to improve adhesion of the object with its embedding resin or resins, the radiation it reflects is substantially depolarized, so having a component at 90° to the incoming polarized radiation. In the alternative configuration described here, PU 32 arranges that polarizer 323 and analyzer 325 have crossed polarizations, or operator 23 presets these orientations, so that the specular reflection from the surfaces and interiors of layers 38 and 40 is absorbed, whereas the depolarized radiation from object 46 is transmitted. The crossed polarizations thus provide a good image of object 46 having high contrast with material surrounding the object.

In an alternative implementation for polarizing illuminating radiation, neither polarizer 323 nor analyzer 325 are used. Rather, source 50 is implemented to provide polarizing illumination, and beamsplitter 326 is configured as a polarizing beamsplitter which transmits the polarizing illumination from the source. The polarizing beamsplitter acts to reflect the depolarized radiation, comprising radiation from object 46, to sensor 56, so forming a good image of the object, as described above.

Referring back to FIG. 1, beamsplitter 52 may be configured as a polarizing beamsplitter at the wavelength of source 50, so that sensor 56 in apparatus 20 forms an image of object 46 substantially similar to that formed in apparatus 320.

The polarizing embodiments described above enable sensor 56 to polarizeably analyze the returning radiation from object 46 and its surroundings.

For polarizing embodiments, to reduce speckle source 50 may comprise a laser emitter with a coherence length less than the dimensions of an object being machined. For example, for a circular pad, the coherence length may be significantly smaller than the diameter of the pad. Other methods for reducing speckle, such as are exemplified above, may also be used.

The embodiments described above have related to using an optical image of PCB 24 and/or an embedded object 46 to adjust actual positions for micromachining the PCB. However, it will be appreciated that other types of images of the PCB and/or an embedded object may be used by PU 32 to determine the required actual positions. In addition, it will be understood that embodiments of the present invention may be used to image objects embedded in, or on a surface of, materials other than PCBs, such as ceramic or glass. Those having ordinary skill in the art will be able to modify the description above, without undue experimentation, to accommodate changes required by the other types of images.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

We claim:

1. A method for micromachining a material, comprising:
   configuring an optical system to provide illumination of an illumination wavelength to a site of the material via a given element of the optical system, the illumination generating returning radiation from the site;
   configuring the optical system to receive the returning radiation via the given element, and to form an image of the site therefrom;
   calculating an actual position of a location at the site from the image and outputting a signal indicative of the actual position of the location;
   generating a beam of micromachining radiation having a micromachining wavelength different from the illumination wavelength;
   positioning the beam to form an aligned beam with respect to the location in response to the signal; and
   conveying the aligned beam to the location via at least the given element of the optical system so as to perform a micromachining operation at the location.

2. The method according to claim 1, wherein the site comprises an object embedded in one or more dielectric substrates.

3. The method according to claim 2, wherein providing illumination to the site comprises providing structured illumination that illuminates only a region surrounding the object.

4. The method according to claim 3, wherein providing the structured illumination comprises forming the structured illumination with a diffractive element.

5. The method according to claim 1, wherein providing illumination to the site comprises selecting the illumination wavelength to be a wavelength at which the site fluoresces, and wherein the returning radiation comprises fluorescent radiation generated at the site in response to the provided illumination.

6. The method according to claim 5, and comprising filtering the fluorescent radiation to optimize the image of the site.

7. The method according to claim 1, wherein providing illumination to the site comprises providing polarized illumination to the site, and wherein forming the image of the site comprises polarizeably analyzing the returning radiation from the site.

8. The method according to claim 1, wherein the given element comprises a steerable mirror.

9. The method according to claim 8, wherein the site comprises a plurality of different sub-sites wherein micromachining is to be performed, and wherein positioning the beam comprises directing the beam to the plurality of different sub-sites by only steering the mirror.

10. The method according to claim 1, wherein the given element comprises an optical element train which is configured to focus the beam and the illumination to the site.

11. The method according to claim 1, wherein the site comprises a site area, and wherein providing illumination to the site comprises providing illumination to the site area and to a further area no larger than the site area and contiguous therewith.

12. The method according to claim 11, wherein forming the image comprises forming the image on an image sensor, and wherein the illumination has an intensity that generates the image on the image sensor in 3 milliseconds or less.

13. The method according to claim 11, wherein forming the image comprises forming the image on an image sensor comprising an array of pixels, and selecting pixels for analysis of the image from the array in response to the area and the further area.

14. The method according to claim 1, and comprising determining a nominal position of the location prior to providing the illumination to the site, and providing the illumination in response to the nominal position.

15. The method according to claim 1, wherein generating the beam of micromachining radiation comprises:
   generating a low-power beam at a power for the beam below an ablation threshold for the site;
   conveying the low-power beam to the site; and
   determining an offset for the beam in response to an image of the low-power beam at the site.

16. The method according to claim 15, wherein positioning the beam comprises positioning the beam in response to the offset.

17. The method according to claim 15, wherein conveying the positioned beam to the location comprises setting the beam to have a power equal to or greater than the ablation threshold.

18. The method according to claim 1, and comprising configuring the illumination wavelength to have a value for which the site is non-absorbing.

19. The method according to claim 1, wherein the site comprises an external surface, and wherein providing illumination to the site comprises illuminating the site with imaging radiation normal to the external surface.

20. The method according to claim 1, wherein providing illumination to the site comprises providing coherent imaging radiation at the site, the coherent imaging radiation have a coherence length equal to or less than twice a dimension of the site.

21. The method according to claim 1, wherein calculating the actual position comprises:
providing a theoretical relationship in accordance with an expected image of the site;
determining an actual relationship from the image; and
fitting the actual relationship to the theoretical relationship.

22. The method according to claim 1, wherein forming the image of the site comprises adjusting at least one of the illumination wavelength and a power of the illumination so as to vary a depth of penetration of the illumination at the site.

23. The method according to claim 1, wherein the site comprises an object embedded in a diffusive layer, and comprising compensating for a deviation resulting from the image being formed of the object embedded in the diffusive layer.

24. Apparatus for micromachining a material, comprising:
a radiation source which is configured to provide illumination of an illumination wavelength to a site of the material via a given element of an optical system, the illumination generating returning radiation from the site;
an image sensor which is configured to receive the returning radiation via the given element, and to form an image of the site therefrom;
a beam source which is configured to generate a beam of micromachining radiation having a micromachining wavelength different from the illumination wavelength; and
a processor which is configured to calculate an actual position of a location at the site from the image and to output a signal indicative of the actual position of the location, to position the beam to form an aligned beam with respect to the location in response to the signal, and to operate the beam source so that the aligned beam is conveyed to the location via at least the given element of the optical system so as to perform a micromachining operation at the location.

25. The apparatus according to claim 24, wherein the site comprises an object embedded in one or more dielectric substrates.

26. The apparatus according to claim 25, wherein providing illumination to the site comprises providing structured illumination that illuminates only a region surrounding the object.

27. The apparatus according to claim 26, and comprising a diffractive element which forms the structured illumination.

28. The apparatus according to claim 24, wherein the illumination wavelength comprises a wavelength at which the site fluoresces, and wherein the returning radiation comprises fluorescent radiation generated at the site in response to the provided illumination.

29. The apparatus according to claim 28, and comprising a set of filters configured to filter the fluorescent radiation, and wherein the processor is configured to select one of the set to optimize the image of the site.

30. The apparatus according to claim 24, wherein the illumination comprises polarized illumination, and comprising a polarization element enabling the image sensor to polarizeably analyze the returning radiation from the site.

31. The apparatus according to claim 24, wherein the given element comprises a steerable mirror.

32. The apparatus according to claim 31, wherein the site comprises a plurality of different sub-sites wherein micromachining is to be performed, and wherein positioning the beam comprises directing the beam to the plurality of different sub-sites by only steering the mirror.

33. The apparatus according to claim 24, wherein the given element comprises an optical element train which is configured to focus the beam and the illumination to the site.

34. The apparatus according to claim 24, wherein the site comprises a site area, and wherein providing illumination to the site comprises providing illumination to the site area and to a further area no larger than the site area and contiguous therewith.

35. The apparatus according to claim 24, wherein the illumination has an intensity that generates the image on the image sensor in 3 milliseconds or less.

36. The apparatus according to claim 24, wherein the image sensor comprises an array of pixels, and wherein the processor is configured to select pixels from the array for analysis of the image in response to the area and the further area.

37. The apparatus according to claim 24, wherein the processor is configured to determine a nominal position of the location prior to the radiation source providing the illumination to the site, and wherein the processor is configured to direct the radiation source to provide the illumination in response to the nominal position.

38. The apparatus according to claim 24, wherein generating the beam of micromachining radiation comprises generating a low-power beam at a power for the beam below an ablation threshold for the site, and wherein the processor is configured to convey the low-power beam to the site, and to determine an offset for the beam in response to an image on the image sensor of the low-power beam at the site.

39. The apparatus according to claim 38, wherein positioning the beam comprises positioning the beam in response to the offset.

40. The apparatus according to claim 39, wherein conveying the aligned beam to the location comprises setting the beam to have a power equal to or greater than the ablation threshold.

41. The apparatus according to claim 24, and comprising configuring the illumination wavelength to have a value for which the site is non-absorbing.

42. The apparatus according to claim 24, wherein the site comprises an external surface, and wherein providing illumination to the site comprises illuminating the site with imaging radiation normal to the external surface.

43. The apparatus according to claim 24, wherein the radiation source is configured to provide coherent imaging radiation at the site, the coherent imaging radiation having a coherence length equal to or less than twice a dimension of the site.

44. The apparatus according to claim 24, wherein the processor is configured to:
receive a theoretical relationship in accordance with an expected image of the site;
determine an actual relationship from the image; and
fit the actual relationship to the theoretical relationship.

45. The apparatus according to claim 24, wherein the processor is configured to adjust at least one of the illumination wavelength and a power of the illumination so as to vary a depth of penetration of the illumination at the site.

46. The apparatus according to claim 24, wherein the site comprises an object embedded in a diffusive layer, and wherein the processor is configured to compensate for a deviation resulting from the image being formed of the object embedded in the diffusive layer.

* * * * *